(12) United States Patent
Lee et al.

(10) Patent No.: US 6,927,598 B2
(45) Date of Patent: Aug. 9, 2005

(54) TEST PROBE FOR ELECTRICAL DEVICES HAVING LOW OR NO WEDGE DEPRESSION

(75) Inventors: Sang-Bin Lee, Schenectady, NY (US); Gerald Burt Kliman, Niskayuna, NY (US); Waheed Tony Mall, Waterford, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/717,533

(22) Filed: Nov. 20, 2003

(65) Prior Publication Data

US 2004/0100300 A1 May 27, 2004

Related U.S. Application Data

(63) Continuation-in-part of application No. 10/270,326, filed on Oct. 15, 2002, now Pat. No. 6,847,224.

(51) Int. Cl.[7] .................................................. G01R 31/34
(52) U.S. Cl. ...................................................... 324/772
(58) Field of Search ................................ 324/234–242, 324/258, 545–546, 772; 73/865.8, 865.9

(56) References Cited

U.S. PATENT DOCUMENTS

| | | | | |
|---|---|---|---|---|
| 4,803,563 A | * | 2/1989 | Dailey et al. ................ | 324/262 |
| 4,970,890 A | * | 11/1990 | Jaafar et al. ................ | 73/12.09 |
| 4,996,486 A | * | 2/1991 | Posedel ........................ | 324/545 |
| 5,012,684 A | * | 5/1991 | Humphries ................... | 73/865.8 |
| 5,252,927 A | * | 10/1993 | Bruhlmeier et al. ......... | 324/546 |
| 5,295,388 A | * | 3/1994 | Fischer et al. .............. | 73/12.09 |
| 5,341,095 A | * | 8/1994 | Shelton et al. .............. | 324/772 |
| 5,557,216 A | * | 9/1996 | Dailey et al. ................ | 324/772 |
| 5,990,688 A | * | 11/1999 | Bourgeois et al. .......... | 324/545 |
| 6,469,504 B1 | * | 10/2002 | Kliman et al. ............... | 324/228 |
| 6,489,781 B1 | * | 12/2002 | Kliman et al. ............... | 324/545 |
| 6,847,224 B2 | * | 1/2005 | Lee et al. .................... | 324/772 |
| 2003/0117144 A1 | * | 6/2003 | Sutton ......................... | 324/546 |

FOREIGN PATENT DOCUMENTS

RU  2082274  6/1997

OTHER PUBLICATIONS

"Experience With Modified Iron Fault Control Technique for the Stator Cores of Electrical Machines," V.B. Berezhansky, L.I. Chubraeva; Paper STP EM 05-07-0205 accepted for presentation at the IEEE/KTH Stockholm Power Tech. Conference, Stockholm, Sweden, Jun. 18–22, 1993.

"Electric Generators: Potential Problems and Recommendation Solutions," William G. Moore, P.E., National Electric Coil (52 pgs.); Electric Generators: Potential Electric Generators: Potential . . . <http://www.carilec.com/Assets/Presentations%202001/Moore–Carilec–7–25–01.pdf>.

* cited by examiner

Primary Examiner—Jermele M. Hollington
(74) Attorney, Agent, or Firm—William E Powell, III; Patrick K. Patnode

(57) ABSTRACT

A probe for use in detecting abnormalities in an electrical device having a wedge depression of no more than 100 mils. The probe includes a solid core surrounded by a sense coil. The ends of the core are arranged in a contact-free, spaced relationship between and at least partially above opposed surfaces of adjacent lamination teeth of a stator. Air gaps are maintained between the ends of the probe core and the opposed surfaces. The total of the two air gaps is constant. The probe is supported on a carriage arrangement and moved along the teeth. Variations in leakage flux produced with the stator energized with an energization winding to produce a flux which is a few percent of a normal energization level, are monitored.

21 Claims, 16 Drawing Sheets

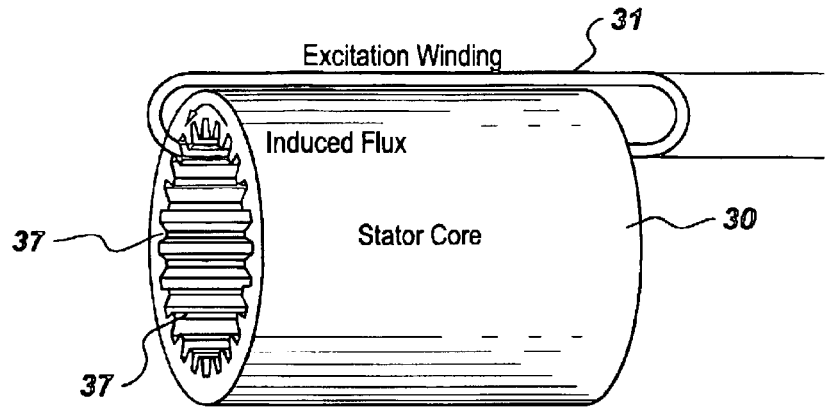
Fig. 1  Prior Art
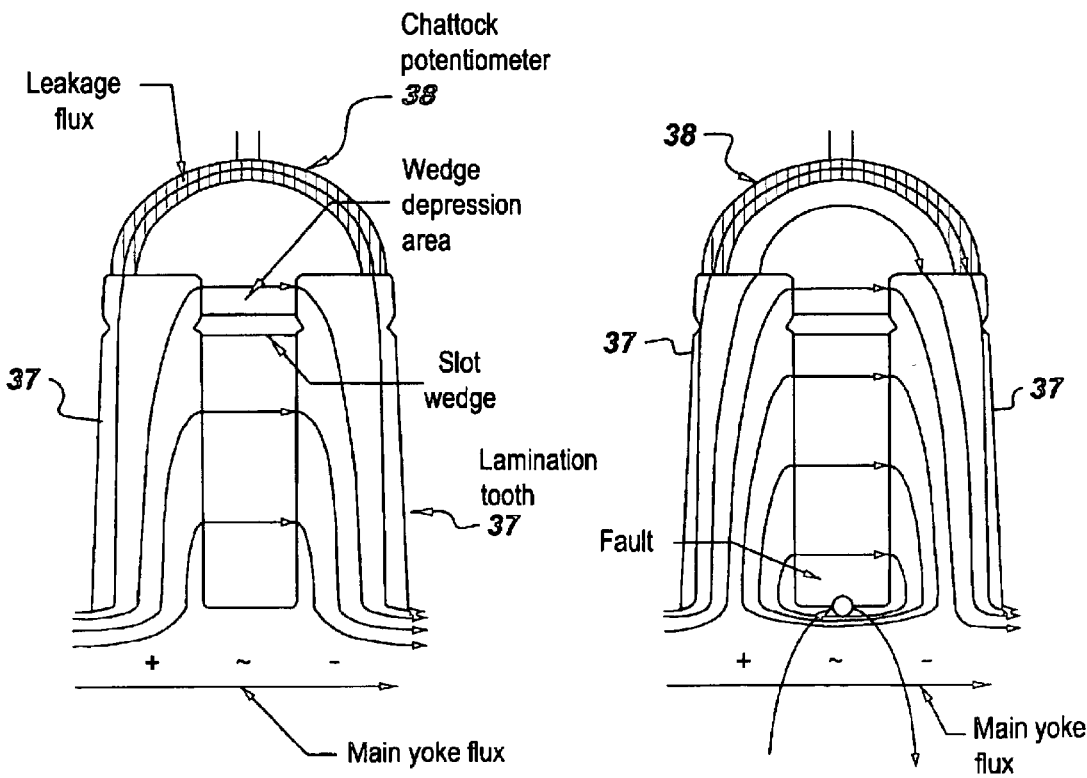
Fig. 4
Prior Art
Fig. 5
Prior Art

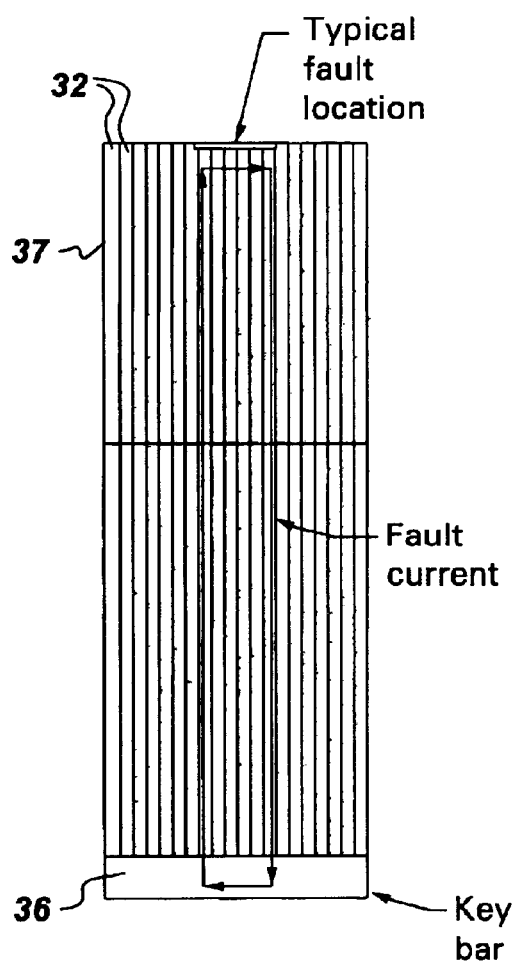
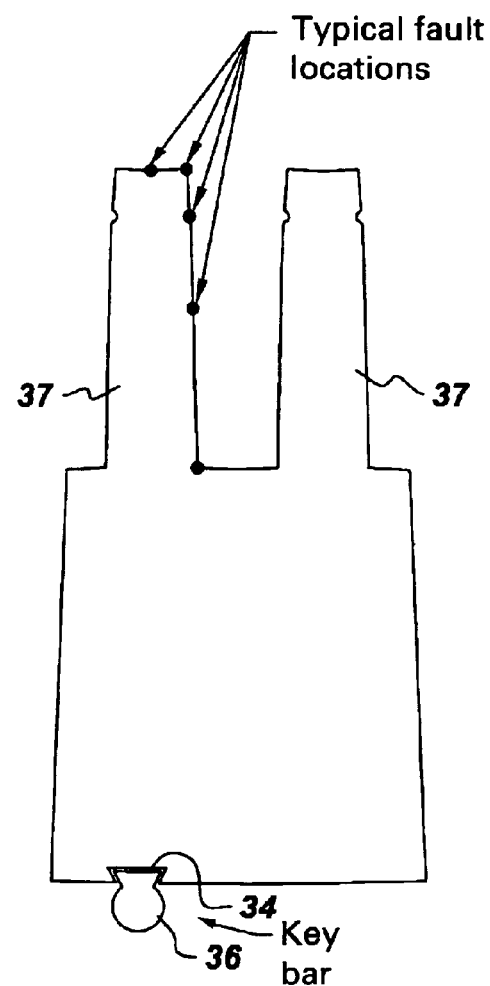
Fig. 2
Prior Art
Fig. 3
Prior Art

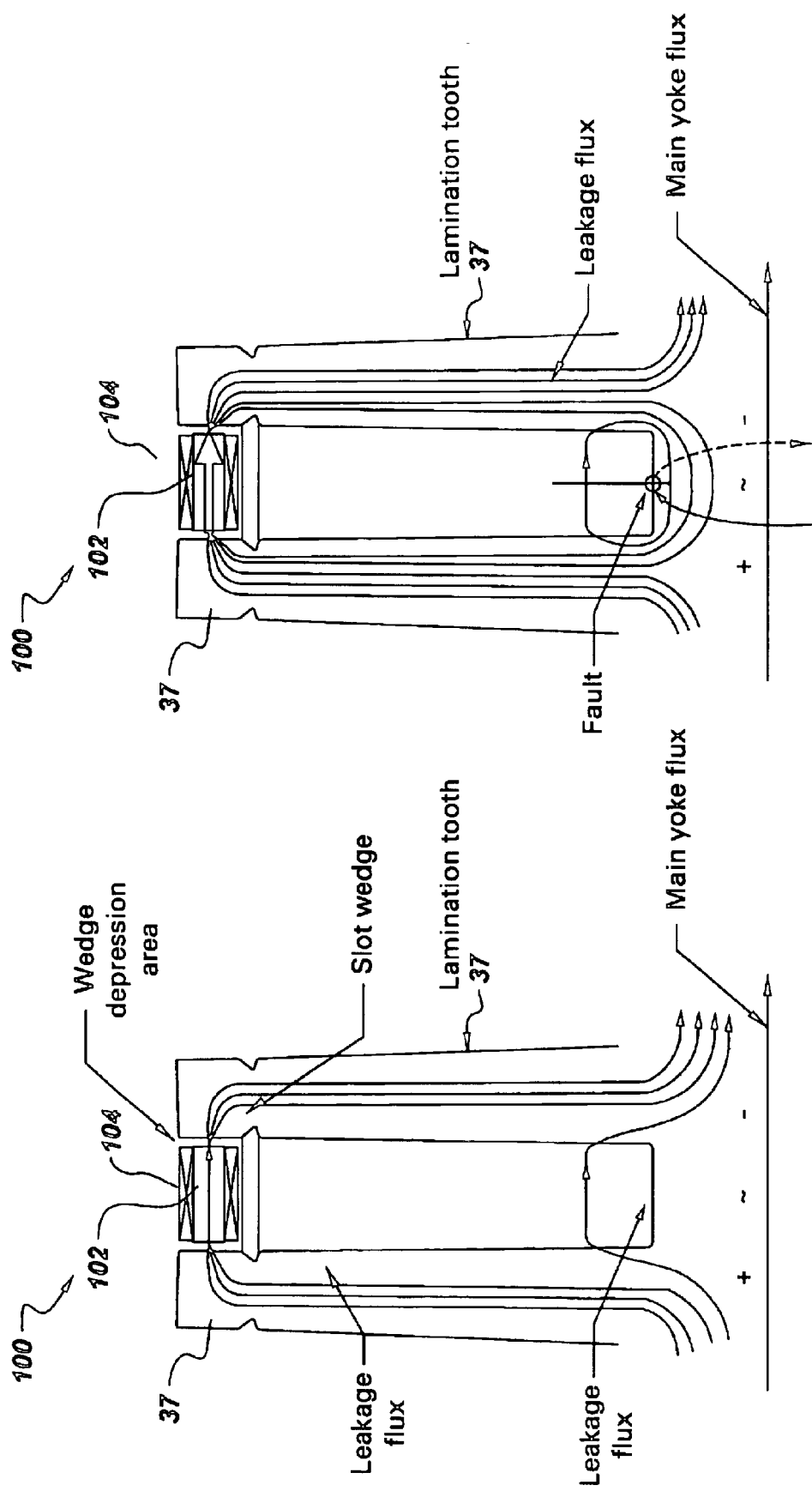

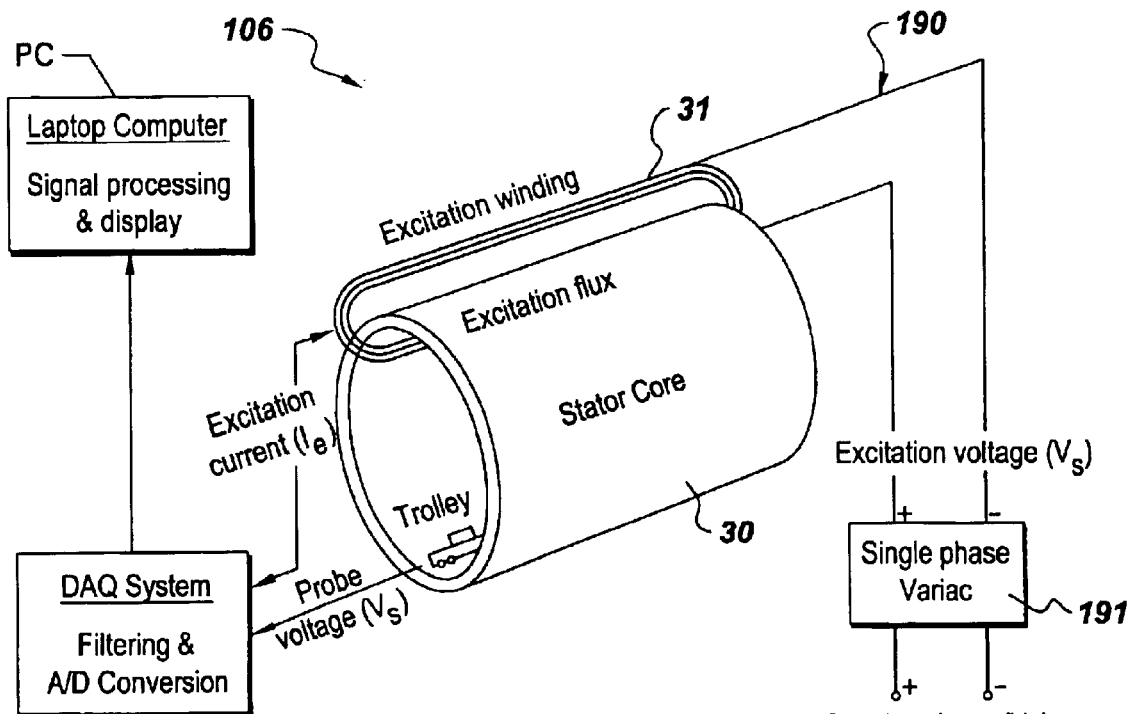
*Fig. 13*
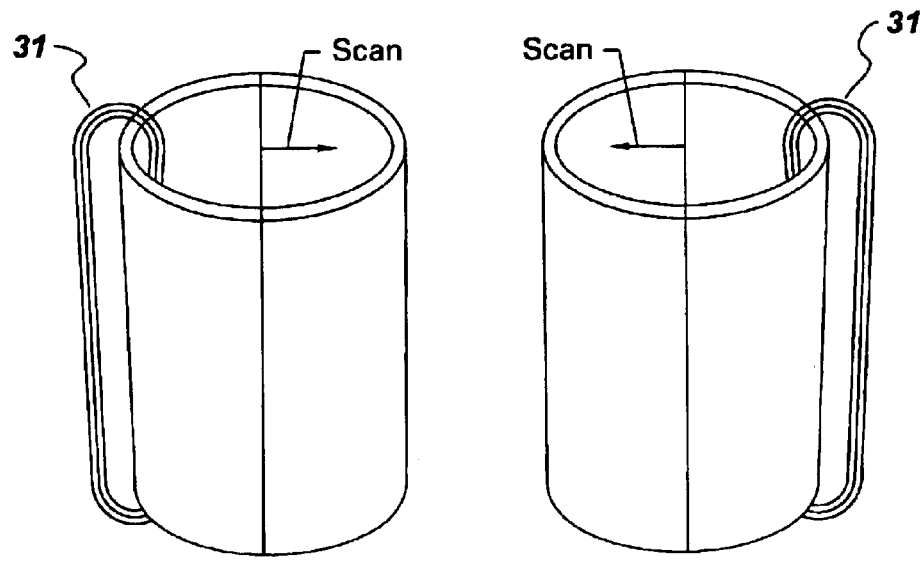
*Fig. 14*  *Fig. 15*

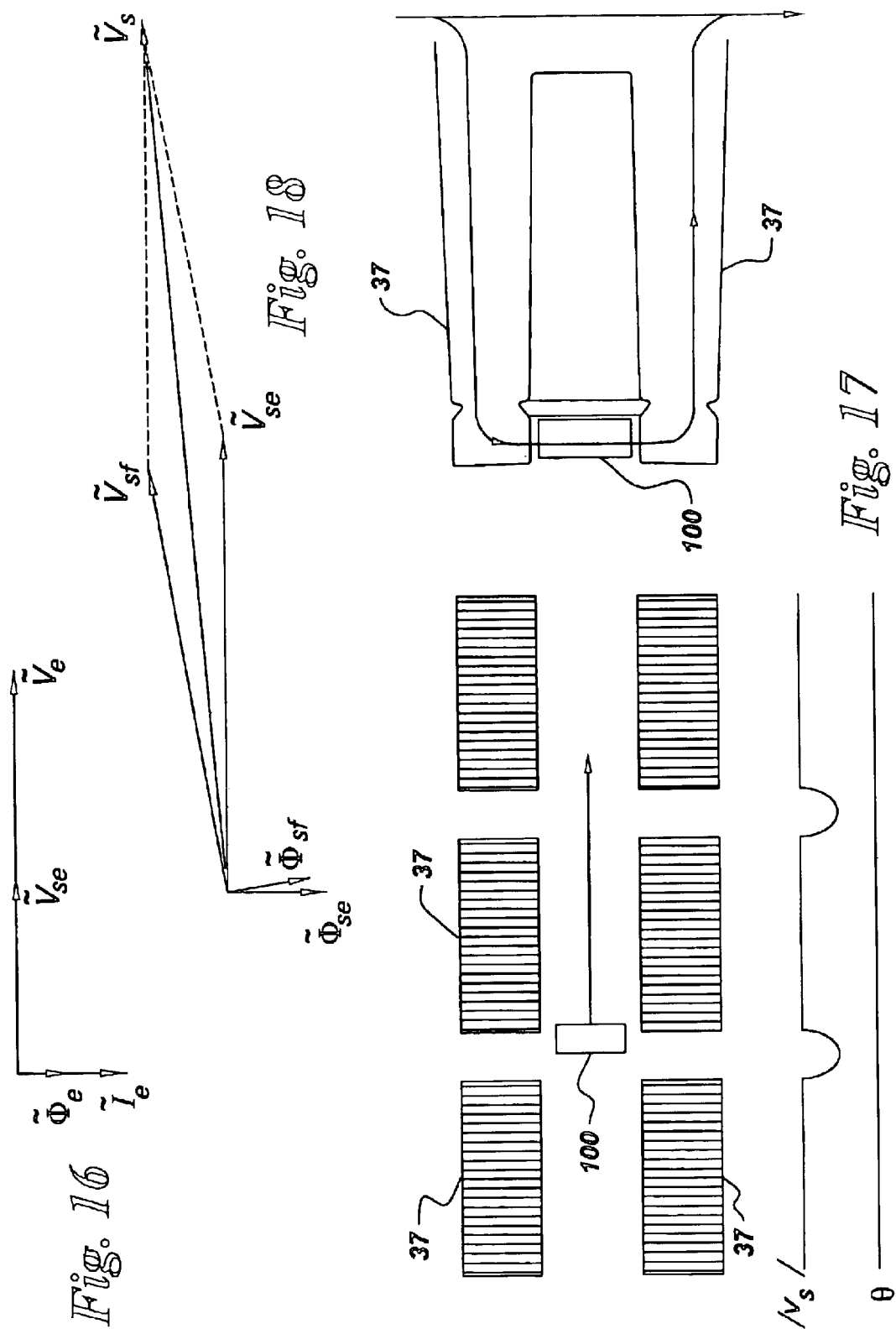

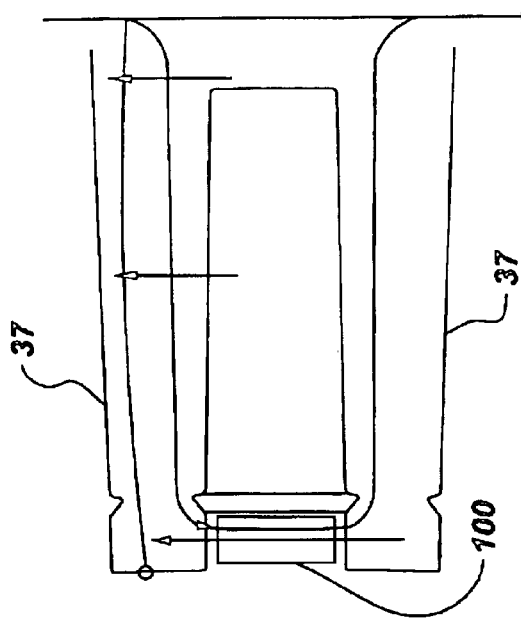
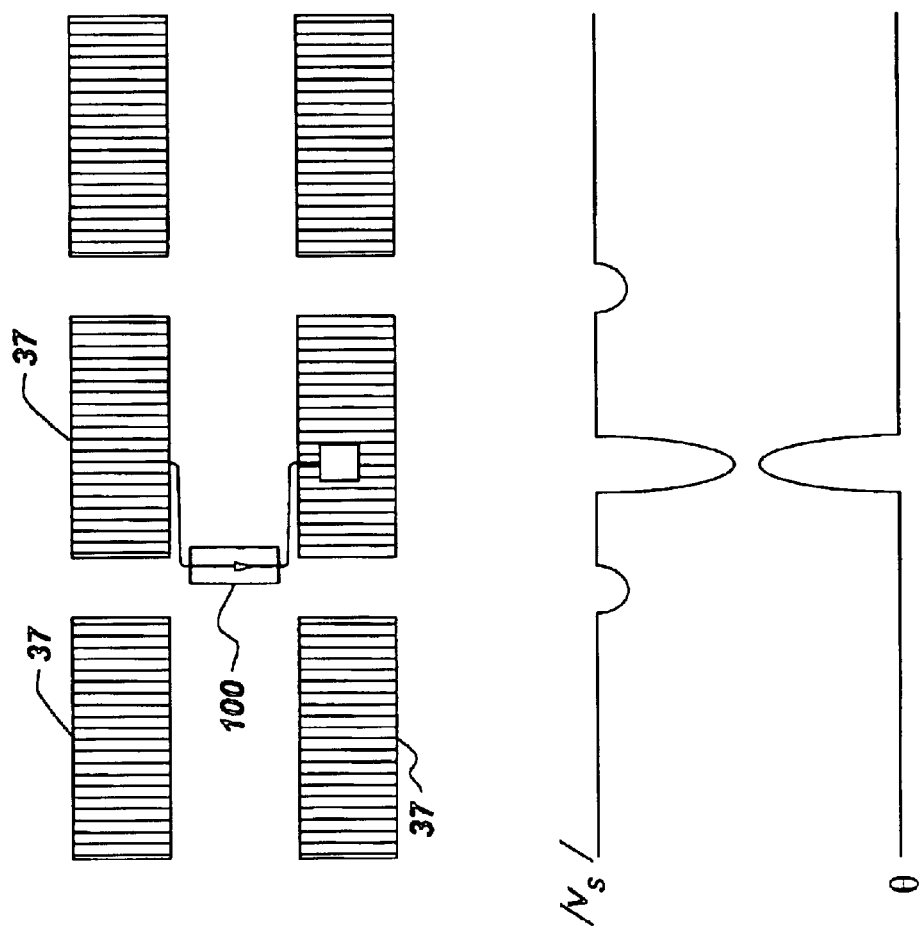
Fig. 21

TEST PROBE FOR ELECTRICAL DEVICES HAVING LOW OR NO WEDGE DEPRESSION

CROSS-REFERENCE TO RELATED APPLICATIONS

This application is a continuation-in-part of prior application Ser. No. 10/270,326, filed Oct. 15, 2002 now U.S. Pat. No. 6,847,224, the entirety of which is incorporated herein by reference.

BACKGROUND

The invention relates generally to the diagnosis and monitoring of the operation of electrical apparatus. More specifically, the present invention relates to a probe or sensor arrangement which facilitates the detection of flaws/imperfections in electrical apparatus, such as stator cores of large generators having low or no wedge depressions, and which requires the stator to be energized only to a low level for detection purposes.

In the field of generating electricity on a commercial scale it is important that elements of the power generating system forming part of a 50–1000 MVA power generating arrangement, for example, remain fully functional over their expected working lives so that unexpected downtimes and/or catastrophic failures can be avoided. To avoid such problems it is important that elements, such as the large stators which form part of the above-mentioned generating systems, be carefully inspected and tested either during regular periodic maintenance or before being sold and installed in a power generating installation.

A stator core 30 of electric machines (such as schematically depicted in FIG. 1) utilizes thin insulated steel laminations 32 to reduce the eddy current flow for higher efficiency operation. The laminations are, as shown in FIGS. 2 and 3, stacked vertically by placing dovetail grooves 34 of the laminations 32 in the dovetail of a key bar 36, which is attached to the frame. To hold the laminations 32 together, and to prevent vibration of the laminations 32, the core 30 is axially clamped with a force of about 300–350 psi.

Shorting of the laminations 32 can be caused by manufacturing defects, damage during assembly/inspection/rewind, stator-rotor contact, vibration of loose coil wedges/laminations, foreign magnetic material, etc. If the laminations 32 are shorted for any reason, a larger circulating current is induced in the fault loop that consists of fault—laminations—key bar (see FIG. 2). The typical fault locations are shown in FIG. 3. The circulating fault current increases with the number of shorted laminations and the conductivity between the laminations 32 and the short/key bar 36. The fault current increases the power dissipation in the stator core 30 and causes localized heating. The hot spots can progress to more severe localized heating and eventually cause burning or melting of the laminations 32. As a result, the stator bar insulation and windings can also be damaged, causing ground current flow through the stator core 30. Therefore, inter-laminar core faults should be detected and repaired to prevent further damage and to improve the reliability of generator operation.

In order to detect imperfections in stator core construction, various tests have been developed.

The so called "ring test" relies upon the detection of the eddy current heating caused by the short circuit currents. The generator core 30 is wound with a number of turns, typically less than ten, of cable to form toroidal-shaped excitation windings 31 in the manner schematically depicted in FIG. 1. The current level in the windings 31 is chosen such that the flux driven in the core 30 is near normal operating levels (approximately 1–1.5 Tesla). The excitation requirement is at the several MVA level, since several hundred amperes and volts in the coil are needed to achieve the desired flux. The core 30 is operated in this manner for several hours. Thermal imaging cameras are then used to find "hot spots" on the inner stator surface. These hot spots indicate the location of the inter-lamination short circuits.

However, short circuits that are located below the surface of the stator teeth 37 and slots are difficult to find, since thermal diffusion causes the surface temperature rise to become diffuse/spread out. Because of the high power levels used in the ring test, personnel cannot enter the bore of the stator core during testing. Further, cables used in the test must be appropriately sized for the MVA level, which leads to long setup and removal times.

With this type of test, the high flux used is a cause for concern because the high currents (hundreds of amperes and several kVs) require a test supply capable of several MVA. The high current and voltage levels require care in the selection and installation of the excitation winding on the generator core and obscure parts of the core. Because the heating test is run on a core that is deprived of its normal cooling system, excessive heating can lead to core damage. The high current and voltage levels impact operator safety, and as mentioned above, personnel are not allowed to enter the core interior when a ring test is running.

To overcome the above-mentioned shortcomings which tend to be encountered with the ring test, the so called "EL CID" (Electromagnetic Core Imperfection Detection) test was developed.

This test relies upon detection of the magnetic field caused by the short circuit currents that flow due to inter-lamination short circuits. As in the ring test, the generator core is wound with a number of turns in the manner of a toroid. The current level in the windings is chosen such that the core operates at approximately 4% of the normal operating flux. This corresponds to about a five volt/meter electric field induced along the core surface. The current requirement is in the 10–30 ampere range, so that a rather simple power supply of several kVA can be used. A magnetic potentiometer, referred to as a Chattock coil after its inventor, is used to sense the magnetic fields produced between two adjacent teeth by the short circuit currents that are induced in the inter-lamination insulation faults.

The Chattock coil (a.k.a. Maxwell worm or magnetic potentiometer) is used to sense the phase quadrature component of the magnetic field produced by any induced inter-laminar currents. Chattock coil voltages equivalent to those produced by a 100 mA or larger test current are used as an indicator for a severe inter-laminar short for the 4% flux excitation level.

The Chattock coil 38 typically spans the width of two adjacent teeth 37, in the manner shown in FIGS. 4 and 5, and is moved along the surface of the stator either by hand or by a robotic carriage. Because the short circuit current path is largely resistive, the magnetic flux created by the short circuit is in phase quadrature with the exciting flux. The signal from the Chattock coil is combined with a reference signal derived from the excitation current so that phase sensitive detection methods can be used to extract the fault signal from the background noise.

A fully digital EL CID system has been developed. This system exhibits improved noise suppression over the previous analog arrangements. Nevertheless, there are a number of anomalies and distortions that can arise when performing the EL CID test, and these must be interpreted using knowledge and experience of core construction.

The EL CID test involves exciting the core in a manner similar to that of the ring test, but uses much lower voltage and current levels. A flux of 4–5% is normal. The EL CID test procedure exhibits the following characteristics. The current required for this flux can be obtained from a variable transformer that is supplied from a standard electrical outlet. The induced voltage from this low flux is kept to about five volts/meter, so personnel can enter the core during the EL CID test to make observations. The induced currents at this flux are low enough not to cause excessive heating, so additional core damage due to testing is not a concern.

The EL CID test is better able to find inter-laminar faults which are located below the surface. This is a significant advantage over the ring test that relies upon thermal diffusion from the interior hot spot in order to provide detection. However, this test is such that the signal level in the coil results in high noise levels, especially when scanning in the end step region.

Another type of sensor arrangement is disclosed in USSR Inventor's Certificate No. RU 2082274 C1. This arrangement is directed to improving the sensitivity of the method and improving the interpretation and reliability of results. As depicted in FIGS. 6 and 7, it consists of a magnetizing winding 40, a device 42 for regulating the current in the winding and two sensors 44, 46. Each of these two sensors 44, 46 comprises, as shown in FIG. 6, a coil 48 wound onto a thin plate core 50 of ferromagnetic material with high magnetic permeability. The sensors 44, 46 have the same construction; however, one is used as a reference probe and the other is used as a scanning probe.

The outputs of the two sensors 44, 46 are connected to independent inputs of a phase shift device 52, which acts as a phase monitor. The phase difference between the voltages of the two sensor units is used as a fault indicator. The outputs of the phase shift device are supplied to a personal computer (PC) or similar type of device via an A/D converter 54.

The two sensors 44, 46 can be supported on a triangular carriage arrangement 56 shown in FIG. 8 and thus moved through the interior of the stator under the control of a position control device 58, as shown in RU 2082274 C1.

However, this arrangement suffers from several drawbacks. It is sensitive to gap variation due to probe location. The magnitude and phase of the measured signal is very sensitive to the gap between lamination and probe (gap variation is an inherent limitation due to lamination surface roughness). That is to say:

Magnitude of $V_{sense} \propto 1/\text{gap}$;

Phase of $V_{sense} \propto \tan^{-1}(\text{const/gap})$

It is additionally difficult to scan and diagnose in the end step region (see FIG. 12 for example) of a stator core since the location makes it difficult to scan while maintaining a constant gap in the end step region.

Further, it is difficult, if not impossible, to construct a universal probe design. Since the teeth project inwardly into the interior from the inner cylindrical surface of the stator, they are inclined by a predetermined amount toward each other. Thus, the flat ferromagnetic core members 50 must be slightly angled and have a very shallow V-shape in order for each end of the RU 2082274 C1 arrangement to sit flat on the top of a tooth. With the change in diameter of a stator core, the angle and distance between the teeth vary and it is necessary for both the length and the angle of the shallow V-shape to vary. A change in the number of teeth also induces a change in the angle defined between the tops of two adjacent teeth, and thus induces the same problem.

A large percentage of hydro-generators and large motors have a wedge depression length of less than 200 mils. Other large motors have a wedge depression in which a salient structure protrudes, thereby lessening the effective wedge depression. A probe design that addresses one or more of the deficiencies of known probes and that accommodates wedge depression lengths of less than 200 mils or wedge depressions having protruding structures therein is needed.

SUMMARY

A first aspect of the invention resides in a probe for detecting abnormalities in an electrical device having an effective wedge depression of no more than 200 mils. The probe includes a probe core having first and second sensing end portions and a sense coil wound about the probe core. The probe is adapted to detect abnormalities in the electrical device in a spaced, contact-free relationship between and at least partially above opposed adjacent surfaces of portions of the electrical device, forming first and second air gaps between the first and second sensing end portions of the core and the respective opposed adjacent surfaces.

A second aspect of the invention resides in a sensing apparatus for detecting abnormalities in an electrical device having an effective wedge depression of no more than 200 mils. The sensing apparatus includes means for supporting a probe having a core with sensing end portions and a coil wound about the core and means for moving the probe to a new location with respect to the opposed surfaces and detecting leakage flux at the new location. The means for supporting a probe are adapted to maintain the sensing end portions of the core in a contact-free, spaced relationship between and at least partially above opposed surfaces of members which form part of the electrical device and through which leakage flux passes.

A further aspect of the invention resides in a sensing apparatus for detecting abnormalities in an electrical device having an effective wedge depression of no more than 200 mils. The sensing apparatus includes a probe having a structure through which leakage flux passes and a probe carriage. The probe includes a probe core having first and second sensing end portions and a sense coil wound about the probe core. The probe carriage includes a probe extension piece attached to the probe and at least one probe location adjustment screw for adjusting the location of the probe to a spaced, contact-free relationship between and at least partially above opposed adjacent surfaces of portions of the electrical device to form first and second air gaps between the first and second sensing end portions of the core and the respective opposed adjacent surfaces.

Another aspect of the invention resides in a system for detecting abnormalities in an electrical device having an effective wedge depression of no more than 200 mils. The system includes a probe including a core formed of a material having high initial permeability and high resistivity characteristics and a coil wound about the core and a probe carriage adapted to support the probe so that sensing portions of the core are maintained in a contact-free, spaced relationship between and at least partially above predetermined opposed surfaces of the electrical device and so that the sensing portions of the core are exposed to leakage flux produced by the electrical device which passes between the opposed surfaces and through air gaps defined between the opposed surfaces and the sensing portions of the core. The system further includes an excitation winding removably disposed with the electrical device and operatively connected with a source of excitation voltage for inducing a flux in an electrical circuit in the electrical device and a data acquisition system operatively connected with the excitation winding and the sensor coil for monitoring the output of the sensor and detecting faults in the electrical device which cause change in the leakage flux.

Another aspect of the invention resides in a method for detecting faults in an electrical device having an effective wedge depression depth of no more than 200 mils. The method includes the steps of supporting a probe, having a solid core and a coil wound about the core, in a contact-free, spaced relationship between and at least partially above adjacent surfaces of members which form part of the device and through which leakage flux passes and inducing energization of the electrical device to a predetermined level which is lower than a normal operating level for producing leakage flux. The method also includes the steps of detecting a leakage flux which occurs between the opposed surfaces using the probe, moving the probe to a new position with respect to the opposed surfaces and detecting a leakage flux at the new position, and monitoring the fluctuation in probe output and detecting a fault in response to the detection of an abnormal leakage flux.

These and other advantages and features will be more readily understood from the following detailed description of preferred embodiments of the invention which is provided in connection with the accompanying drawings.

BRIEF DESCRIPTION OF THE DRAWINGS

FIG. 1 is a perspective schematic view of a stator core such as that to which the embodiments of the sensor arrangement are applicable.

FIGS. 2 and 3 are respectively side and front view of stator laminations depicting the manner in which the stator core is constructed from a plurality of thin insulated steel laminations, which are connected to the frame of the stator by way of dovetail grooves and key bars.

FIG. 4 is a schematic front view of two stator teeth which are being examined using an EL CID type sensor arrangement and which depicts the leakage flux that is produced when there is no fault associated with the teeth.

FIG. 5 is a schematic front view of two stator teeth which are being examined using the EL CID type sensor arrangement and which depicts the leakage flux which is produced when there is fault associated with the teeth.

FIG. 9 is a schematic front view showing the deployment of a probe or sensor according to an exemplary embodiment of the invention and depicting the leakage flux that occurs in the absence of a fault.

FIG. 10 is a schematic front view similar to that shown in FIG. 9, but which depicts the situation wherein a fault has occurred and the leakage flux has changed accordingly.

FIG. 13 is a diagram showing an example of a circuit arrangement that can be used in conjunction with the sensor/probe of FIGS. 9 and 10 to detect the fluctuation in leakage flux.

FIGS. 14 and 15 are schematic depictions of stators that demonstrate how the excitation coil can be disposed with respect to sensor position to reduce noise during examination of the stator.

FIG. 16 is an example of a phasor diagram showing characteristics that are obtained with a fault free or healthy core system.

FIG. 17 is a compound schematic diagram depicting sensor position and signals that are obtained with healthy lamination arrangement.

FIG. 18 is an example of a phasor diagram that is produced when a sub-wedge fault condition is detected.

FIG. 21 is a compound schematic diagram depicting sensor position and the signals that are obtained in the presence of a surface fault condition.

DETAILED DESCRIPTION OF THE PREFERRED EMBODIMENTS

Figure 6:
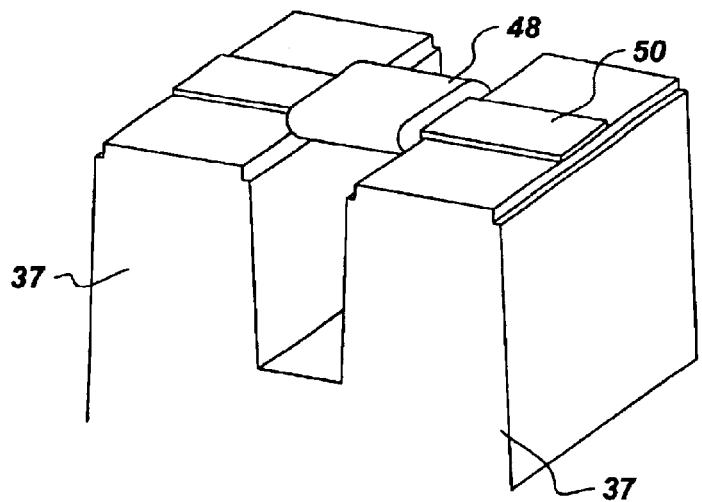
FIG. 6 is a perspective view showing the RU 2082274 C1 prior art sensor arrangement referred to in the opening paragraphs of this disclosure.
Figure 7:
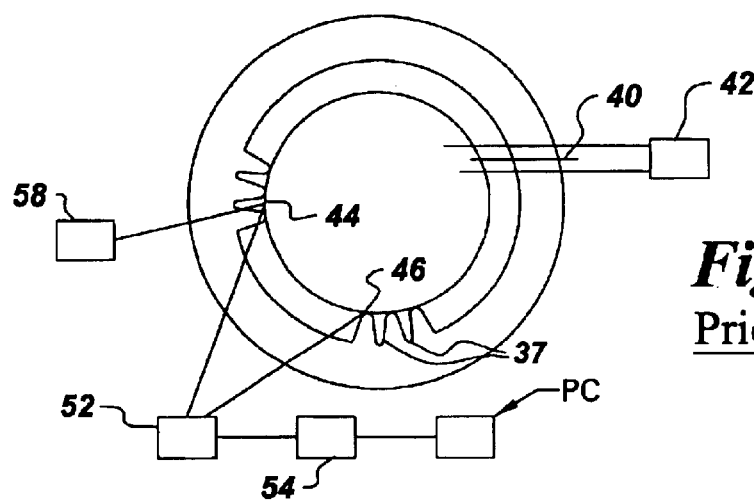
FIG. 7 is a schematic view showing the manner in which the two sensors that are used with the RU 2082274 C1 arrangement are deployed in a stator core along with the circuitry associated with the testing procedure.
Figure 8:
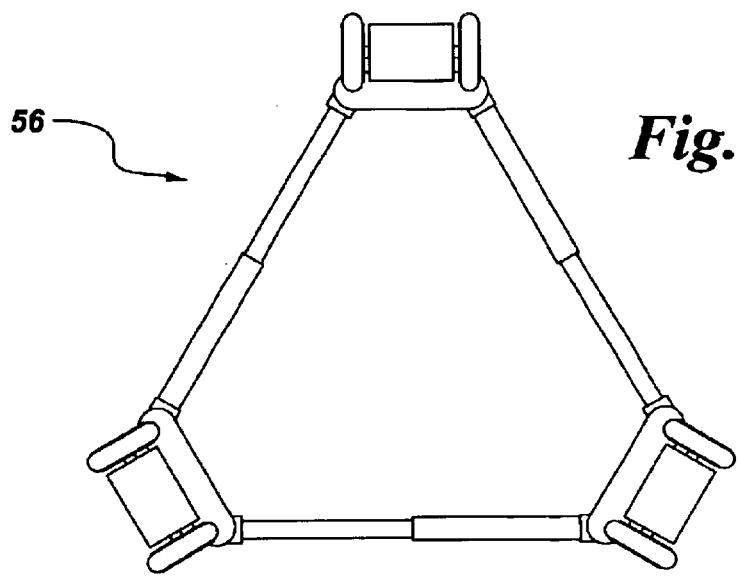
FIG. 8 is a prior art carriage arrangement which is used in connection with the sensors and which is disclosed in RU 2082274 C1.

In brief, a disclosed embodiment of the invention comprises a probe that includes a core and a sense coil surrounding the core. The core is disposed in a contact-free, spaced relationship between opposed surfaces of the device. These surfaces can be the side walls of adjacent lamination teeth of a stator. Small air gaps are carefully maintained between the ends of the core and the opposed surfaces. The effects of probe position are minimized since the net gap is constant. The probe is supported on a carriage arrangement and moved along between the teeth. Variations in leakage flux produced with the stator energized with an energization winding to a few percent of normal energization level, are monitored.

FIGS. 9–13 show an exemplary embodiment of the invention. In this arrangement, the sensor or probe 100 consists of a ferromagnetic sense core 102 that is disposed within a sense coil 104. The sense coil 104 is connected with a circuit arrangement 106 of the nature schematically depicted in FIG. 13. The sense core 102 is located with respect to the laminated teeth 37 so that air gaps 108, 109 (best seen in FIG. 11) are defined between the opposed surfaces of the adjacent teeth between which the probe 100 is disposed and the respective ends of the sense core 102.

This probe arrangement provides enhanced versatility and reliability with which faults can be detected, reduces scan time, and is easy to handle. The basic principle of low level stator core excitation is similar to that of the above-mentioned EL CID, but an iron core probe is used for sensing the signals in the wedge depression area.

The use of a probe having a core formed of a magnetic material results in a significant increase in the signal level since the probe provides a low magnetic reluctance path for the flux. The measured probe voltage is two to three orders of magnitude higher than that of an air core probe, such as a Chattock coil, due to the high flux concentration in the probe, resulting in improved signal to noise ratio of the voltage measurement. The probe is disposed in the wedge depression area with a total air gap of up to 200 mils on either side of the probe.

The maintenance of these air gaps is important to minimize noise being introduced into the output of the probe.

Excitation System

The stator core 30 is, as shown in FIG. 13, operatively connected with an excitation system 190. This excitation system 190 provides a circulating magnetic flux in the yoke of the stator core 30 for fault current excitation. The excitation system comprises a single phase variac 191 and an excitation winding (31). An excitation system comprising a 120/240V single phase variac, excitation winding can be used. Alternatively, a single phase variac and a cable with at least 20 A current conducting capability can also be used to excite the core.

A software program which is run in a personal computer (PC), which forms part of the circuit arrangement 106, calculates and displays the number of excitation winding turns (two to seven) and the excitation voltage that produces a desirable magnetic flux in the core. In order to conduct an example examination, the excitation flux can, for example, be controlled to about 0.075 T (3–4% of rated flux) and the excitation frequency can be controlled to about 50/60 Hz. However, this embodiment of the invention is not limited to these parameters and various others can be used without departing from the scope of the invention.

In accordance with this embodiment of the invention, the calculation of the excitation voltage and number of turns is based on the dimensions of the generator stator core 30. The parameters for calculation of the voltage and number of turns, examples of which are listed below, are those required for calculating the effective area for the circulating flux.

1) Inner Diameter/Radius (ID/IR (in))
2) Outer Diameter Radius (OD/OR (in))
3) Tooth length (TL (in))
4) Core Length (CL (in))

All the parameters can be obtained from the generator design sheets or easily measured. The effective core length can be assumed to be approximately 10–90% of the core length unless otherwise specified since the inside space block and insulation must be taken into account.

It has been observed in field testing that when scanning in a slot near the excitation winding 31, or when internal lighting is used, the noise distorts the signals obtained from the probe due to interference. Therefore, it is recommended that all the lighting (or the like type of electrical equipment) should be removed, and that the excitation winding 31 should be moved to the opposite side of the stator core 30 from the side being scanned at least once during scanning, as shown in FIGS. 14 and 15, so as to be distant from the probe and thus facilitate accurate measurements.

Probe Carriage System

Figure 11:
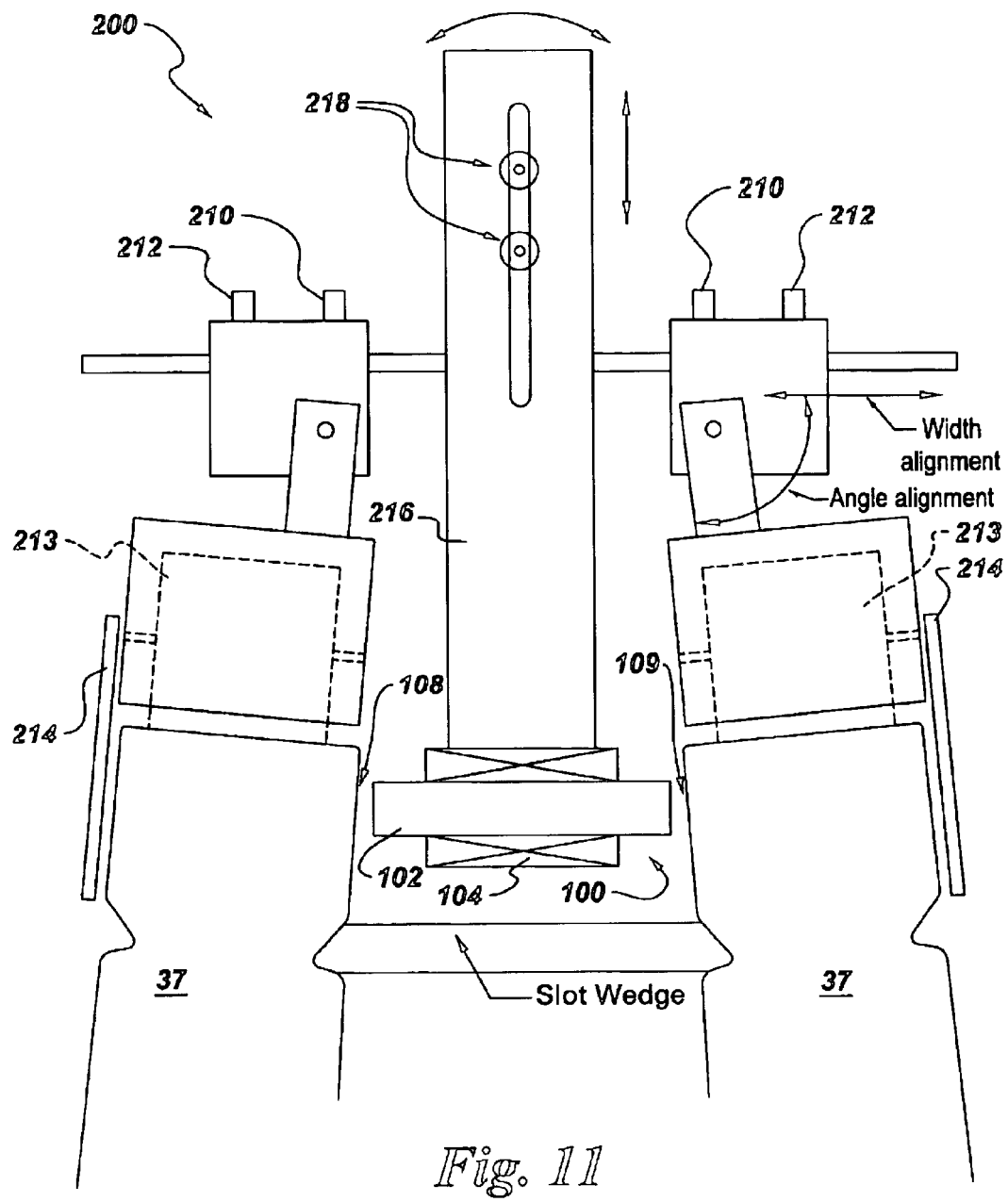
FIG. 11 is a schematic front view showing a carriage arrangement that can be used to support and move the sensor/probe arrangement of FIGS. 9 and 10 in accordance with an exemplary embodiment of the invention.
Figure 12:
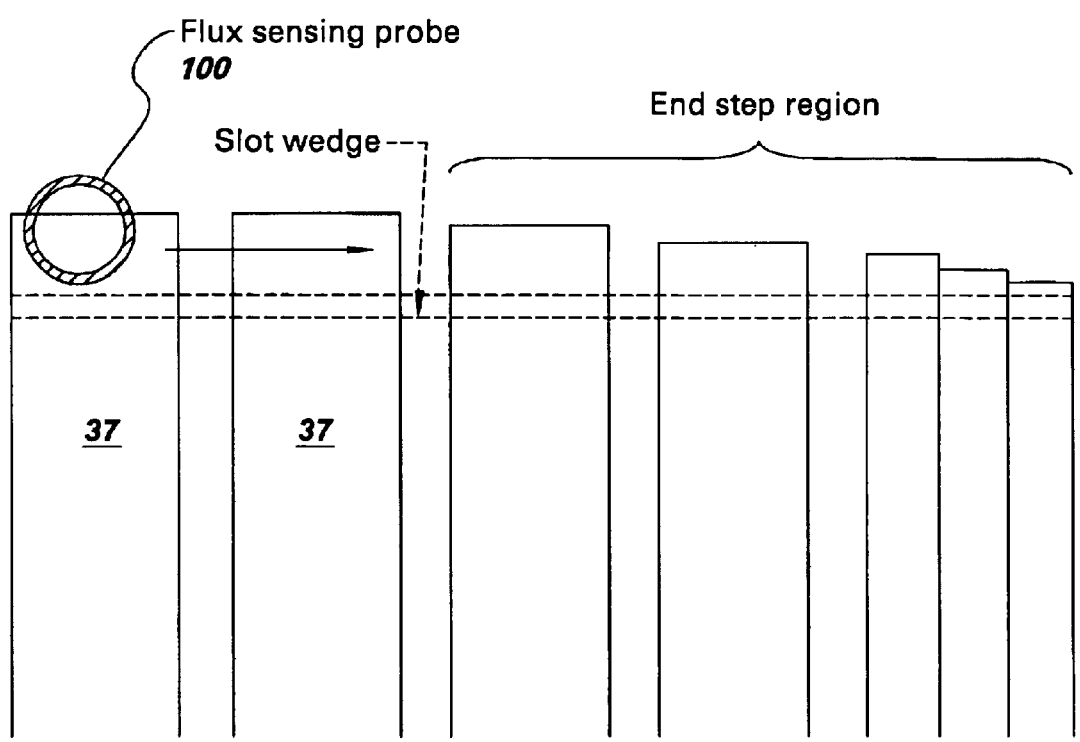
FIG. 12 is a schematic view showing the sensor of FIGS. 9 and 10 being moved through a stator toward the end step region wherein the diameter of the teeth reduce.

In order to facilitate scanning, the probe is supported on a carriage system. An example of a carriage system is shown in FIG. 11. In this arrangement the carriage 200 is designed to suspend the probe in the proper position when scanning in the axial direction. Proper positioning and alignment of 1) the trolley (which forms part of the carriage system) to the generator teeth and 2) the probe to the trolley are important for obtaining accurate measurements.

Selecting the proper probe width is a trade off between signal level and ease of scanning. Increasing the probe width (viz., decreasing the air gaps) increases the signal level, but also increases the chance of contact between the probe core 102 and teeth 37 between which it is disposed. Contact, of course, causes the signal to be noisy. The probe width, which has been experimentally shown to ensure good signal measurement and ease of scanning (no contact), is approximately the slot width minus 150 to 200 mils. For example, if the slot thickness is 1.286 inches (32.66 millimeters) an appropriately sized probe would be anywhere between 1.10 inches (27.94 millimeters) to 1.15 inches (29.21 millimeters) wide.

The width and angle of the trolley wheels 213 can, as shown in FIG. 11, be adjusted by rotating the corresponding adjustment screws 210, 212 so that the trolley guidance plates 214 fit snugly against the outboard sides of the teeth 37, between which the probe is suspended, to prevent tilting of the trolley. The probe 100 should be securely attached to the probe extension piece 216 to avoid tilting and the measurement data becoming inconsistent.

Once the probe 100 is attached to the probe extension 216, the probe 100 should be located in the wedge depression area as shown in FIG. 11 by adjusting the two probe location adjustment screws 218. It is desirable that steel parts of the probe 100 be located at the center of the slot and slightly above the slot wedge.

Data Acquisition System

The two measurements that are taken in accordance with this embodiment of the invention are probe voltage and excitation current. These parameters can be measured using commercially available hardware, such as a Wavebook™ 516 portable data acquisition system marketed by IOtech, Inc.

The software program controls the settings of the data acquisition system and also processes, displays, and stores the data acquired from the scanning of each slot. The software consists of a parameter input screen and a main program screen. The parameter input screen records the details pertaining to the test information and the generator dimensions. The number of excitation winding turns and excitation voltage are calculated and displayed based on the generator dimensions. The main program screen displays the measured and processed signals.

Interpretation of Results

A phasor diagram is used to indicate the status of the inter-laminar core fault system. An example of such a phasor diagram is shown in FIG. 16. In this system $V_e$, $I_e$, and $\Phi_e$ represent the excitation voltage, current, and flux, respectively, and $V_s$, $V_{se}$ are the measured probe voltage and the probe voltage due the excitation.

For properly constructed, defect-free (healthy) laminations without faults, $V_s$ and $V_{se}$ are equal, as depicted in FIG. 16.

The software displays the magnitude of the measured probe voltage in RMS, $V_s$, and the phase angle between the probe voltage and the derivative of the excitation current, θ. Both signals are calculated based on the measured probe voltage and current, and both signals are taken into account to determine the existence, severity, and location of the fault. For healthy laminations, the ideal measured signals and flux distribution are shown in FIG. 17. The dips in the voltage magnitude are caused by the inside space blocks. The magnitude of the voltage is constant except when passing the inside space blocks and the angle is constant throughout the scan. The dips at the inside space block can be counted to estimate the approximate location of the fault when a suspicious signal is found.

When a fault is present inside the slot, the flux distribution changes since the voltage induced in the fault, $V_f$, causes a fault current flow, $I_f$, that induces an additional fault flux component, $\Phi_f$, which changes the flux going through the probe. The phasor diagram under a sub-wedge fault condition is shown in FIG. 18, where $V_{sf}$ is the measured probe voltage component due to the fault, and $V_s$ is the measured probe voltage.

Figure 19:
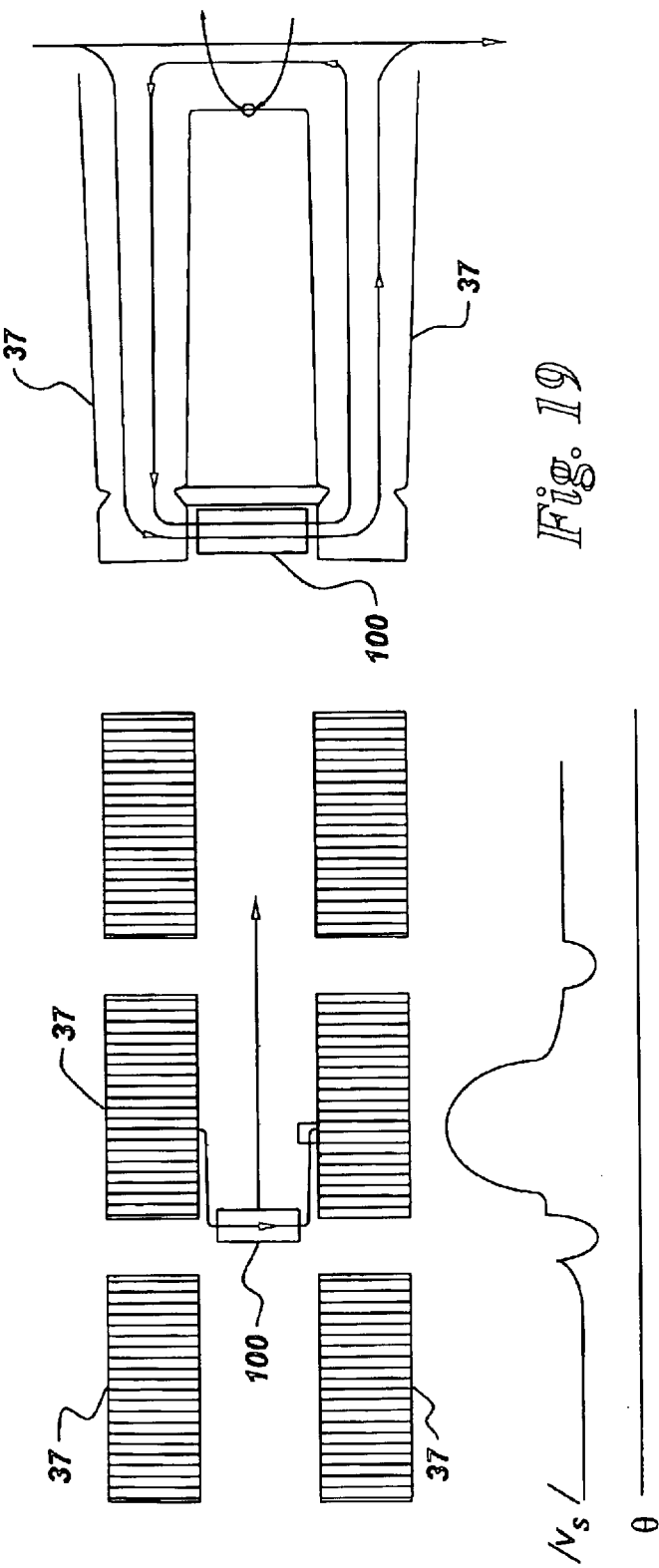
FIG. 19 is a compound schematic diagram depicting sensor position and signals that are obtained when a sub-wedge fault condition is detected.

The measured probe voltage can be assumed as a phasor sum of the voltage component induced due to the excitation flux and the fault flux as shown in FIG. 18 which results from a sub-wedge fault. The typical waveform and flux distribution under this fault condition are as shown in FIG. 19. It can be seen in FIG. 19 that the magnitude change (i.e., increase) in the probe voltage is noticeable under this fault condition, but the angle change is very small. The fault signatures are similar when the faults are between the slot wedge dovetail and the tooth root.

Figure 20:
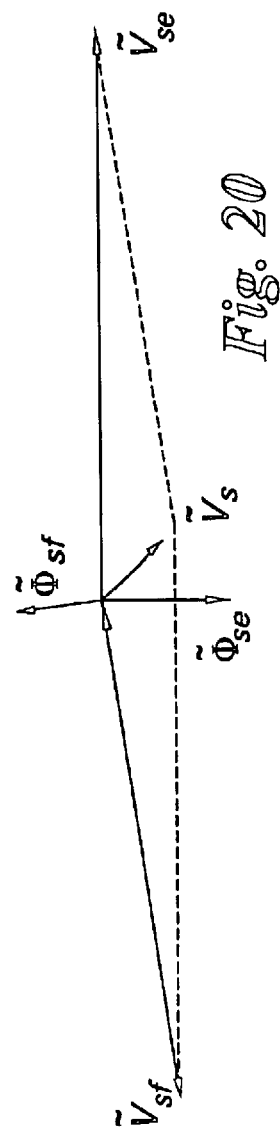
FIG. 20 is an example of a phasor diagram which is produced when a surface fault condition is detected.

The phasor diagram under a surface fault condition (fault on a tooth tip) is shown in FIG. 20. The main difference between a surface fault and a sub-wedge fault is that the fault flux in the probe opposes the excitation flux as shown in FIG. 21. As a result, the probe voltage magnitude decreases and the angle changes significantly.

As will be appreciated from the above examples, the existence of a fault can be determined by any deviation from a healthy signature. The location of the fault can be determined based on the magnitude and angle signatures. It has been observed that both the magnitude and angle change increase with the severity of faults.

Figure 22:
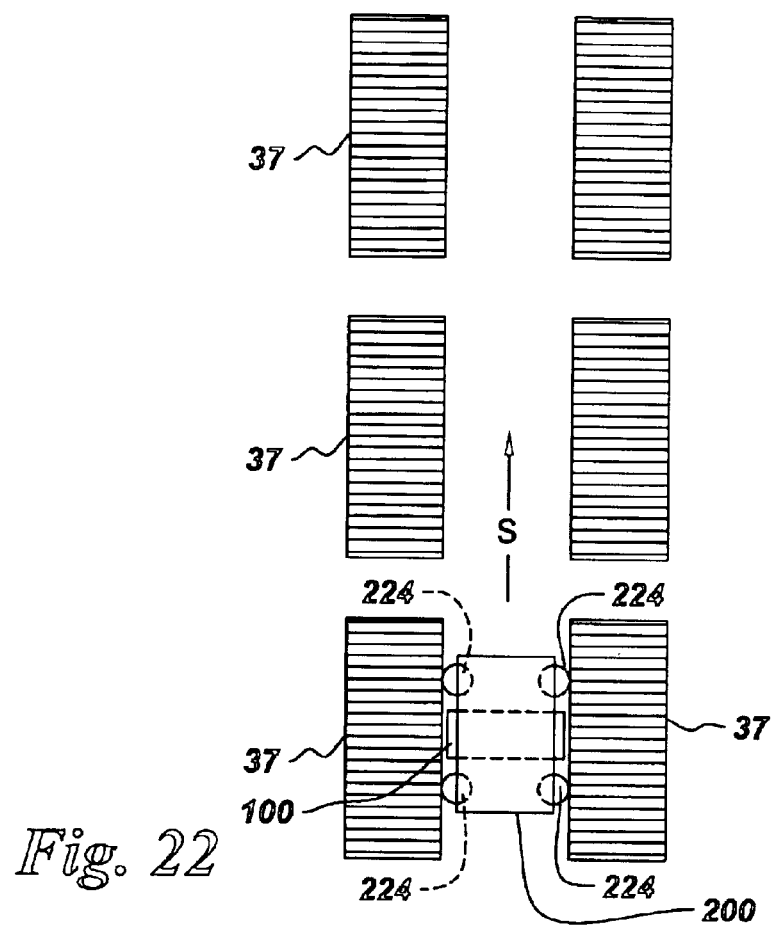
FIGS. 22 and 23 are, respectively, plan and front views showing an alternative exemplary embodiment of a carriage arrangement for supporting and moving the sensor/probe arrangement of FIGS. 9 and 10.
Figure 23:
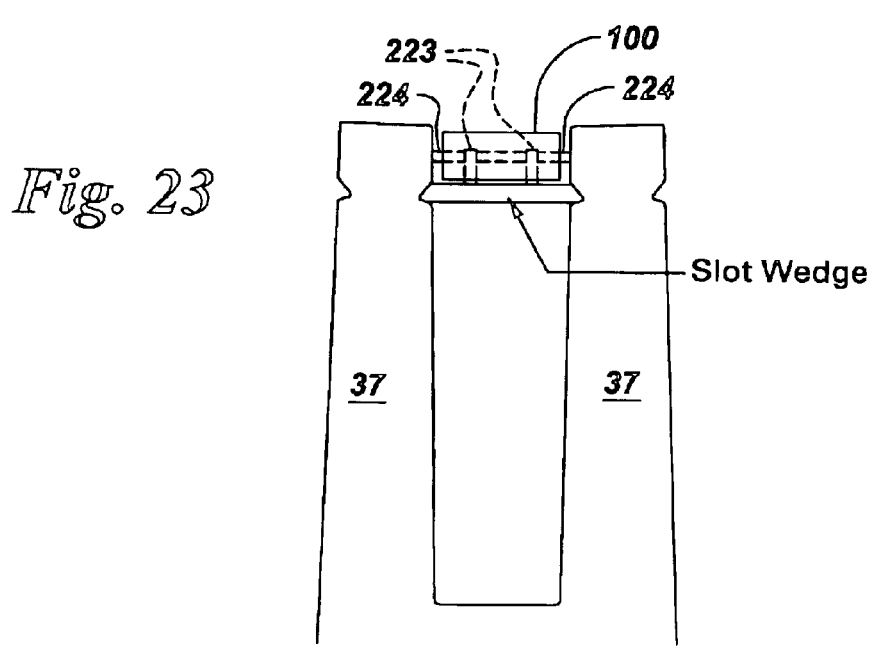

As an alternative to the disclosed probe trolley arrangement it is possible to arrange a trolley or like type of small robotic vehicle to run along the top of the slot wedge in the manner schematically depicted in FIGS. 22 and 23. The trolley or vehicle 200S, in this instance, is supported on rollers 223 and also provided with side rollers 224 that roll along the inboard faces of the teeth 37 between which the probe 100 is disposed. The side rollers 224 can be adjusted to accommodate a change in the distance the inboard faces of the teeth 37. The side rollers 224 can be spring loaded to allow automatic adjustment for differently spaced teeth. The length of the probe core can be rendered adjustable.

This trolley arrangement can be rendered totally robotic and provided with its own independent power source (e.g. batteries) with a transmitter to relay sensed flux data to a remote station. By transmitting in a suitable frequency range, the data can be transmitted to the remote station without being affected by noise or the like.

The core of the probe, which as a solid is different from an air core such as used in the EL CID sensor arrangement, is preferably made of a material which is easy to work with, viz., is neither too hard, too soft nor difficult to shape, and which exhibits high initial permeability under low flux along with high resistivity characteristics. The core 102 can be made of a composite material, a suitable single material such as a metal, or formed of laminations that are secured together. For example, a suitable steel can be used and plates of this type of material (or a mixture of plates of different materials) can be bonded together in order to achieve both the desired shape and durability as well as the above mentioned high initial permeability under low flux and high resistivity characteristics. The core can be configured into any suitable configuration and is not limited to the illustrated shape that has been depicted as being essentially cylindrical for illustrative simplicity.

The probe is not limited to the use of a single core or a single coil and multiple cores and coils can be used. All cores need not pass through a coil and an arrangement that enables the required sensitivity of the flux in the air gaps 108 and 109 is within the purview of the invention. The coils of the probe need not be disposed between the teeth and the core can be configured to extend sensing portions thereof into the space between adjacent teeth and establish the necessary sensing portion—air gap relationship.

It should be noted that the air gaps 108 and 109 need not be equal and that a limited amount of movement of the probe with respect to the sides of the teeth 37 is therefore possible. Given that the total of the air gaps 108 and 109 remains constant and no direct contact between the ends of the core and the teeth occurs, accurate flux detection results are possible.

The probe is not limited to structures that are totally enclosed by the side walls of the teeth 37. The coil 104 and other parts of the probe 100 can be configured as desired and located above the level of the teeth 37 while suitable extensions of the core 102 project down into the space defined between the side walls of the teeth 37, and thus establish the air gaps 108 and 109.

Figure 24:
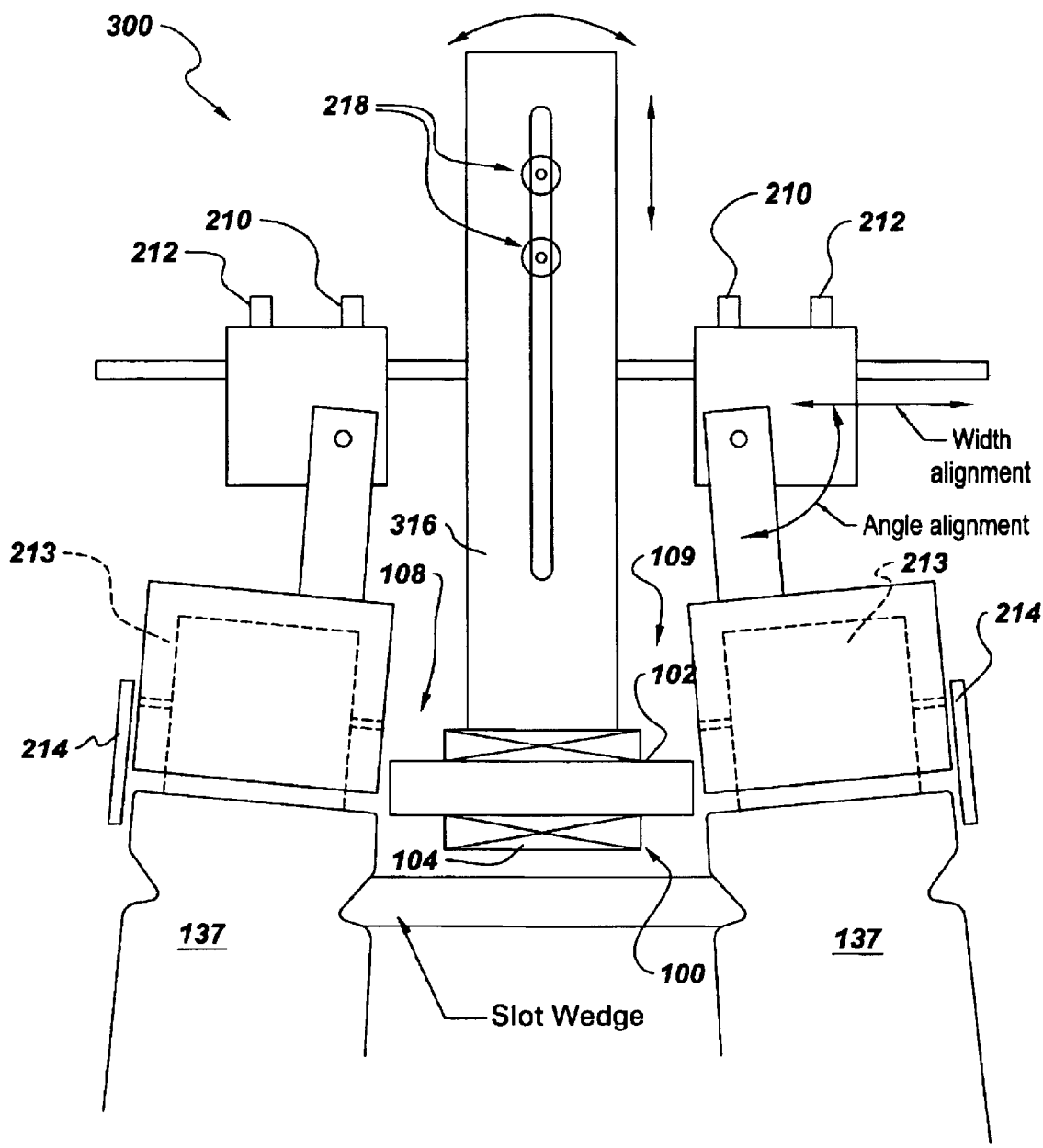
FIG. 24 is a schematic front view showing a carriage arrangement for supporting and moving the sensor/probe arrangement of FIGS. 9 and 10 in accordance with another exemplary embodiment of the invention.

With specific reference to FIG. 24, a carriage arrangement for supporting and moving the sensor/probe arrangement of FIGS. 9 and 10 in accordance with another exemplary embodiment is illustrated. The carriage arrangement shown in FIG. 24 is designed for hydro-generators or other motors that have either no wedge depression or a low wedge depression, namely a wedge depression equal to or less than about 200 mils. In the alternative, the carriage arrangement of FIG. 24 may be used for motors that have a wedge depression of any depth but also having a protruding structure that minimizes the effective wedge depression. As illustrated, the slot wedge between the stator teeth 137 is located such that the wedge depression is less than the wedge depression illustrated in FIG. 11. The carriage 300 is similar to the carriage 200 shown in FIG. 11 with the following differences. The carriage 300 includes a probe extension piece 316, which differs from the probe extension piece 216 (FIG. 11) in that the slot in which the probe location adjustment screws 218 are located is elongated to allow the probe 100 to be moved into an appropriate location above the slot wedge between the stator teeth 137. Alternatively, the probe extension piece 316 may be shortened and the slot left unchanged.

Figure 25:
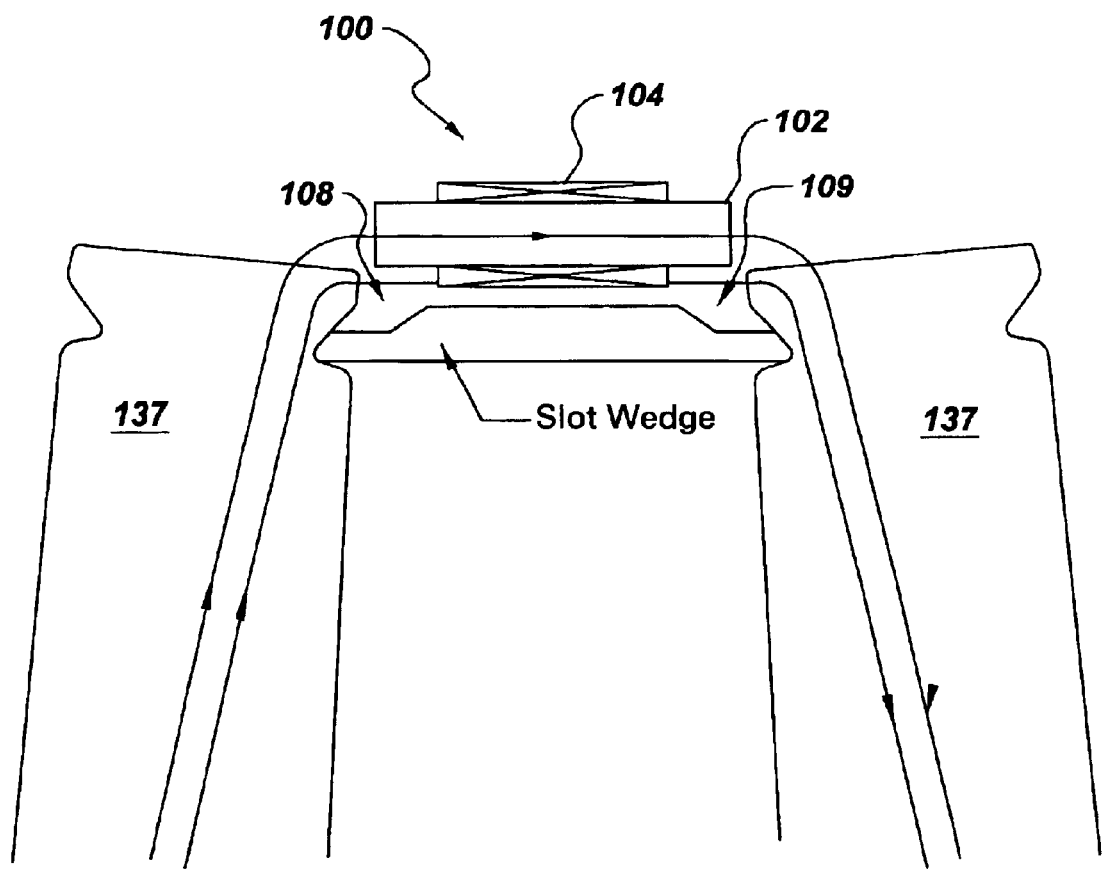
FIG. 25 is a schematic front view showing the sensor/probe of FIGS. 9, 10 and 24 deployed within a stator according to an aspect of the invention.

FIG. 25 illustrates another aspect of the invention. Some low or no wedge depression machines include a slot wedge that has a raised portion. Nonetheless, the probe 100 may be accurately positioned above such a slot wedge and separated from the opposed adjacent surfaces of the stator teeth 137 by the air gaps 108, 109. The location of the probe 100 relative to the stator teeth 137 may lead to a leakage flux in the absence of a fault that extends through the probe 100. A majority of the leakage flux goes through the core 102, but a negligible amount of the leakage flux goes through the coil 104. The carriage assembly is not shown in FIG. 25 for ease of illustration.

Figure 26:
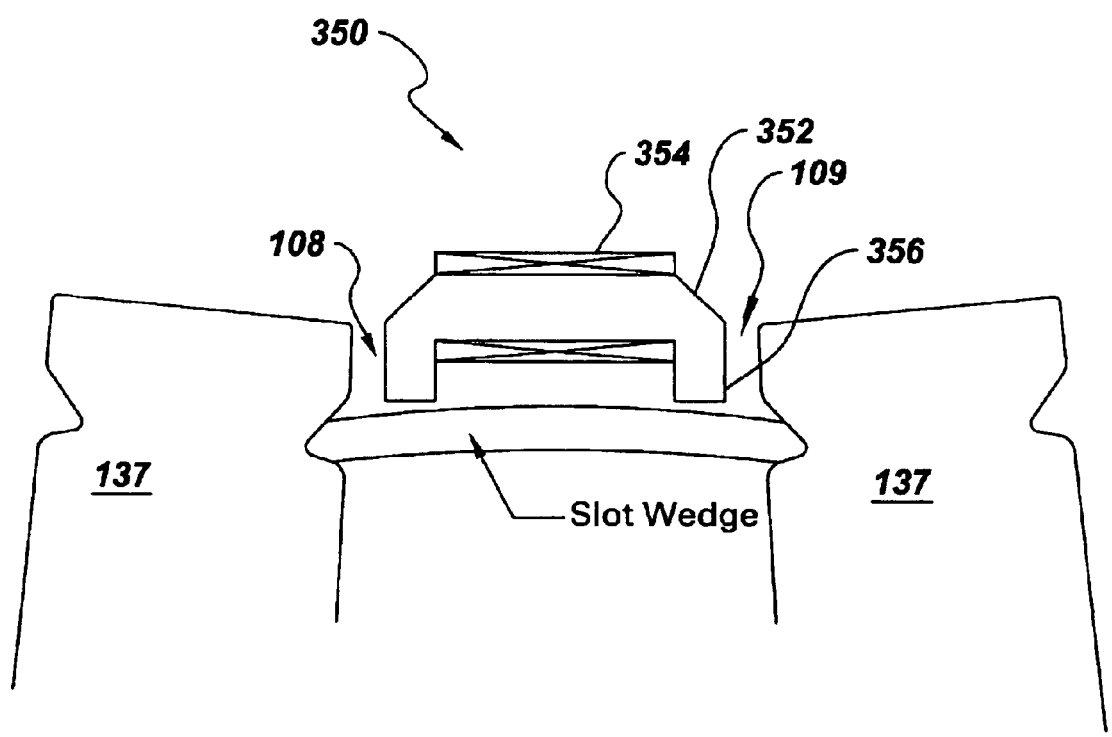
FIG. 26 is a schematic front view showing a probe or sensor deployed within a stator according to another exemplary embodiment of the invention.
Figure 27:
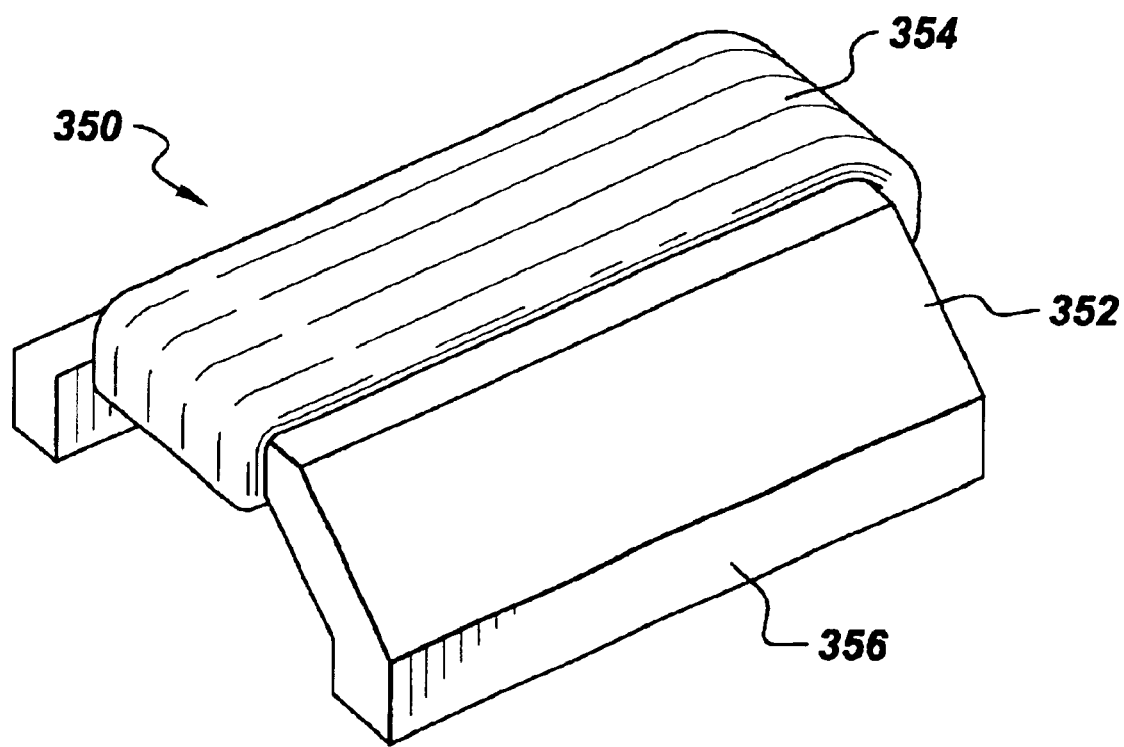
FIG. 27 is a perspective view of the probe of FIG. 26.

FIGS. 26–27 illustrate another exemplary embodiment of the invention. A probe 350 is illustrated which includes a coil 354 wound about a core 352. The core 352 includes a pair of side skirts 356. The skirts 356 enable the probe 350 to be closer to the inner surfaces of the stator teeth 137 and provide protection for the coil 354. Further, the skirts 356 enable the probe ends to be closer to the inner surface of the stator teeth 137, thus improving sensitivity in the measurements.

Figure 28:
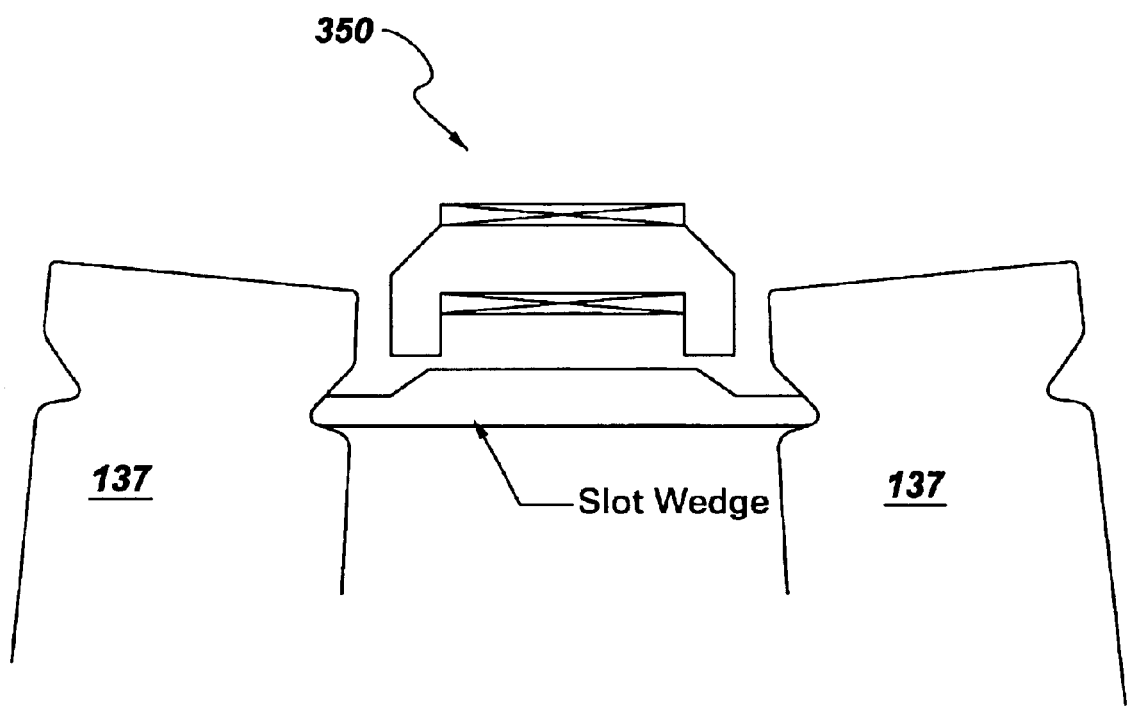
FIG. 28 is a schematic front view showing the probe of FIGS. 26 and 27 deployed within a stator according to an aspect of the invention.

FIG. 28 illustrates the probe 350 positioned over a slot wedge that has a raised portion. With the probe 350 so positioned, the leakage flux extends through the air gap 108, through the skirt 356 and into the coil 354, through the other skirt 356 and through the air gap 109.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected by Letters Patent of the United States is:

1. A probe for detecting abnormalities in an electrical device having an effective wedge depression of no more than 200 mils between a pair of teeth, comprising:
    a probe core having first and second sensing end portions; and
    and a sense coil wound about the probe core;
    wherein said probe is adapted to extend between said pair of teeth and detect abnormalities in the electrical device in a spaced, contact-free relationship between and at least partially above opposed adjacent surfaces of said pair of teeth, forming first and second air gaps between the first and second sensing end portions of the core and the respective opposed adjacent surfaces.

2. The probe of claim 1, wherein said probe is adapted to detect abnormalities in the electrical device in a spaced, contact-free relationship between and completely above opposed adjacent surfaces of said pair of teeth.

3. The probe of claim 1, wherein a total of the first and second air gaps is constant.

4. The probe of claim 1, wherein the core comprises a material having high initial permeability and high resistivity characteristics.

5. The probe of claim 1, wherein the core comprises a plurality of laminated layers formed of a material having high initial permeability and high resistivity characteristics.

6. The probe of claim 1, wherein the core comprises iron.

7. The probe of claim 1, wherein the probe core includes a skirt.

8. A sensing apparatus for detecting abnormalities in an electrical device having an effective wedge depression of no more than 200 mils between a pair of teeth, comprising:
    a probe having a core with sensing end portions and a coil wound about the core;
    means for supporting said probe being adapted to maintain the sensing end portions of the core in a contact-free, spaced relationship between and at least partially above opposed surfaces of said of pair of teeth and through which leakage flux passes; and
    means for moving the probe to a new location with respect to the opposed surfaces and detecting leakage flux at the new location.

9. The sensing apparatus of claim 8, wherein said probe is adapted to detect abnormalities in the electrical device in a spaced, contact-free relationship between and completely above opposed adjacent surfaces of said pair of teeth.

10. The sensing apparatus of claim 9, further comprising means for inducing energization of the device to a predetermined level that is lower than a normal operating level.

11. The sensing apparatus of claim 10, further comprising means responsive to the probe for detecting a leakage flux which occurs between the opposed surfaces.

12. The sensing apparatus of claim 11, further comprising means for monitoring the fluctuation in probe output and determining a presence and location of a fault in response to the detection of an abnormal leakage flux fluctuation.

13. The sensing apparatus of claim 8, wherein the means for supporting the probe comprises a probe extension piece.

14. The sensing apparatus of claim 8, wherein the means for moving the probe comprises a carriage on which the probe is suspended, the carriage being adapted to move the probe to the new position by moving along a surface forming part of the device.

15. A sensing apparatus for detecting abnormalities in an electrical device having an effective wedge depression of no more than 200 mils, comprising:
    a probe having a structure through which leakage flux passes, comprising:
        a probe core having first and second sensing end portions; and
        a sense coil wound about the probe core; and
    a probe carriage, comprising:
        a probe extension piece attached to the probe; and
        at least one probe location adjustment screw for adjusting the location of the probe to a spaced, contact-free relationship between and at least partially above opposed adjacent surfaces of portions of the electrical device to form first and second air gaps between the first and second sensing end portions of the core and the respective opposed adjacent surfaces.

16. The sensing apparatus of claim 15, wherein said probe is adapted to detect abnormalities in the electrical device in a spaced, contact-free relationship between and completely above opposed adjacent surfaces of portions of the electrical device.

17. The sensing apparatus of claim 15, wherein the probe carriage further comprises a plurality of wheels for riding on surfaces of the electrical device normal to the opposed adjacent surfaces.

18. The sensing apparatus of claim 17, wherein the probe carriage further comprises a pair of width adjustors for adjusting the width between opposed ones of the plurality of wheels.

19. A system for detecting abnormalities in an electrical device having an effective wedge depression of no more than 200 mils between a pair of teeth, comprising:
    a probe including a core formed of a material having high initial permeability and high resistivity characteristics and a coil wound about the core;
    a probe carriage adapted to support the probe so that sensing portions of the core are maintained in a contact-free, spaced relationship between and at least partially above predetermined opposed surfaces of said pair of teeth and so that the sensing portions of the core are exposed to leakage flux produced by the electrical device which passes between the opposed surfaces and through air gaps defined between the opposed surfaces and the sensing portions of the core;

an excitation winding removably disposed with the electrical device and operatively connected with a source of excitation voltage for inducing a flux in an electrical circuit in the electrical device; and a data acquisition system operatively connected with the excitation winding and the sensor coil for monitoring the output of the sensor and detecting faults in the electrical device which cause change in the leakage flux.

20. The system of claim 19, wherein the probe carriage further comprises a plurality of wheels for riding on surfaces of the electrical device normal to the opposed adjacent surfaces.

21. The system of claim 20, wherein the probe carriage further comprises a pair of width adjustors for adjusting the width of opposed ones of the plurality of wheels.

* * * * *